United States Patent [19]

Sundstrom

[11] Patent Number: 5,528,172

[45] Date of Patent: Jun. 18, 1996

[54] ADJUSTABLE VOLTAGE LEVEL SHIFTER

[75] Inventor: Lance L. Sundstrom, Pinellas, Fla.

[73] Assignee: Honeywell Inc., Minneapolis, Minn.

[21] Appl. No.: 364,864

[22] Filed: Dec. 27, 1994

[51] Int. Cl.⁶ .................. H03K 19/0175; H03K 19/00
[52] U.S. Cl. .................. 326/80; 326/63; 326/58; 326/68; 327/76
[58] Field of Search ................... 326/63, 62, 58, 326/80, 81, 68; 327/58, 62, 76, 74

[56] References Cited

U.S. PATENT DOCUMENTS

| | | | |
|---|---|---|---|
| 3,599,098 | 8/1971 | McPhall | 327/76 |
| 4,965,469 | 10/1990 | Kondoh et al. | 326/81 |
| 5,155,386 | 10/1992 | Abdi | 327/76 |
| 5,300,835 | 4/1994 | Assar et al. | 327/76 |

*Primary Examiner*—Edward P. Westin
*Assistant Examiner*—Richard Roseen
*Attorney, Agent, or Firm*—Thomas A. Rendos

[57] ABSTRACT

A voltage level shifter is disclosed having an input and an output. The input receives a first signal capable of fluctuating between at least two voltages. The voltage level shifter produces a second signal, at the output, based on the voltage of the input signal and two or more user-defined reference voltages.

16 Claims, 3 Drawing Sheets

ADJUSTABLE VOLTAGE LEVEL SHIFTER

The U.S. Government may have rights in the present application.

BACKGROUND OF THE INVENTION

1. Field of the Invention

This invention generally relates to electronic devices. More particularly, a digital logic voltage level shifter with user-definable voltage levels is presented.

2. Description of the Related Art

The majority of digital devices today employ voltage-sensitive binary logic. In binary logic devices, one voltage level represents a logic '0' or 'low' while a different voltage level represents a logic '1' or 'high'. In positive logic, the lower voltage level represents the logic '0' and the higher voltage level represents a logic '1'. In negative logic, the reverse is true. Typically, the minimum output drive voltage levels exceed the maximum input switching threshold voltage levels by some minimum amount to guarantee error-free operation in the presence of noise and part-to-part variation.

Digital logic devices are fabricated from various materials, such as silicon (Si), germanium (Ge) and gallium arsenide (GaAs), using different process technologies. Typically, each digital logic device is designed to operate around a fixed set of input switching threshold and output drive voltage levels. These voltage levels are determined by design and by the particular combination of materials and process technology used to fabricate that device. To accommodate the large number of possible materials and process technology combinations, several different sets of logic voltage levels have been standardized. Devices constructed from similar materials and process technologies that operate to the same set of input switching threshold and output drive voltage levels are referred to as a logic family, such as 5.0 volt and 3.3 volt CMOS and TTL. The number and type of digital logic families are continuously changing in response to both changing technologies and market demands.

Often, digital devices from different logic families must communicate with each other. Unfortunately, the logic voltage levels of different logic families are often incompatible with each other. Directly connecting devices from different logic families can result in unreliable or even non-functional interfaces. It shall also be noted that newer components of a logic family are sometimes not compatible with the older components.

A few logic level shifters have been designed to interface devices from dissimilar logic families, but each is designed for a single specific interface (e.g. 3.3 volt and 5.0 volt CMOS). With the ever-changing and growing number of logic families on the market today, fixed logic level shifters cannot hope to keep up with the number of possible logic family interface requirements. A design that mixes two or more dissimilar logic families can require several different logic level shifters to satisfy all interface requirements. Unfortunately, this increases the number of part types, the total part count and system cost.

When a large number of devices are connected together on a single net, such as multiple boards connected across a backplane, the capacitance of that net becomes considerable. The amount of power necessary to drive digital data across any net is a function of the total net capacitance, the data switching frequency and the difference between the high and low logic voltage levels. Transceivers are high-drive bi-directional logic buffer devices that are typically used to drive large nets and to buffer other devices from those nets. Some transceiver devices also act as level shifters in that they provide a standard full-swing logic interface on the low-capacitance daughterboard side and a special reduced-swing logic interface on the high-capacitance backplane side. This is done to reduce the power necessary to transmit data across the backplane. Several different sets of reduced swing backplane voltage levels have been standardized. Table 1 lists the logic voltage levels of some standard reduced-swing backplane voltage specifications. Like the low-drive level shifters, each of these high-drive level shifters is designed for a single specific interface, such as 5.0 volt TTL on the board side to BTL on the backplane side. Unfortunately, these devices are too specific to be used for more than a single specific interface.

TABLE 1

Standard Reduced-Swing Backplane Logic Voltage Levels

| Backplane Specification Name | Input Threshold Voltage Levels | | Output Drive Voltage Levels | |
|---|---|---|---|---|
| | VIL | VIH | VOL | VOH |
| Backplane Transceiver Logic (BTL) | 1.475 | 1.625 | 1.100 | 2.100 |
| Center-Tapped Termination (CTT) | 1.300 | 1.700 | 1.100 | 1.900 |
| Enhanced Transceiver Logic (ETL) | 1.400 | 1.600 | 0.400 | 2.400 |
| Gunning Transceiver Logic (GTL) | 0.750 | 0.850 | 0.400 | 1.200 |
| Kuo Transceiver Logic (KTL) | 0.950 | 1.050 | 0.600 | 1.400 |
| Lipp Transceiver Logic (LTL) | 1.700 | 2.100 | 0.000 | 3.300 |
| Low Voltage Swing CMOS (LVSC) | 0.475 | 1.625 | 1.100 | 2.100 |
| Low Voltage TTL (LVTTL) | 0.800 | 2.000 | 0.400 | 2.400 |

SUMMARY OF THE INVENTION

A voltage level shifter is disclosed having an input and an output. The input receives a first signal capable of fluctuating between at least two voltages. The voltage level shifter produces a second signal, at the output, based on the voltage of the input signal and two or more user-defined reference voltages.

DESCRIPTION OF THE PREFERRED EMBODIMENTS

Figure 1:
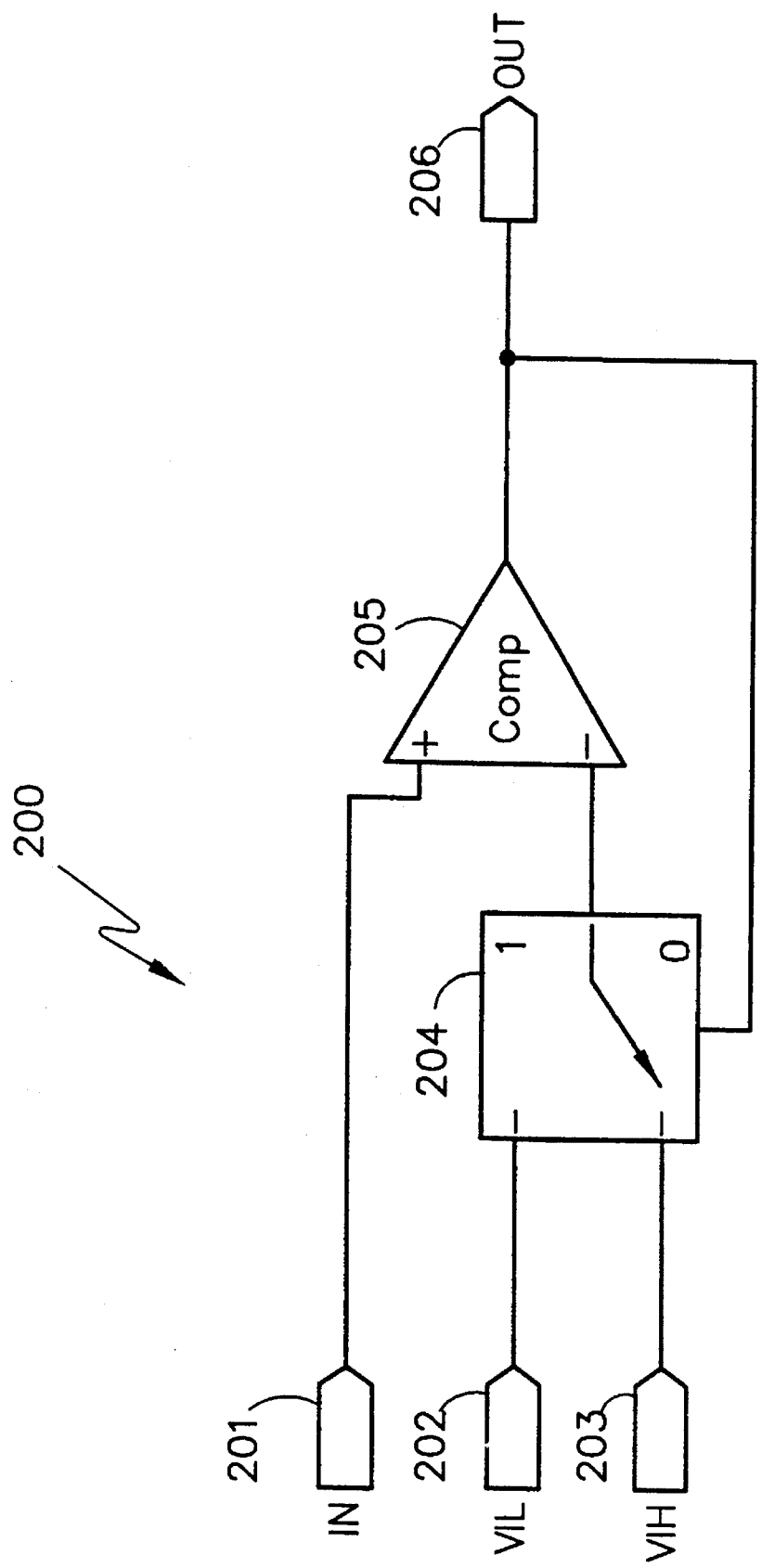
FIG. 1 is a schematic diagram depicting a voltage level shifter having user-definable switching threshold voltage levels.

FIG. 1 schematically depicts the preferred configuration of a voltage level shifter 200 with user-definable switching threshold voltage levels. In the preferred embodiment, voltage level shifter 200 is comprised of an analog voltage comparator 205, a two-to-one (2:1) analog multiplexer 204 (having a select input, a first input and a second input), a VIL (voltage input low) analog input port 202, a VIH (voltage input high) analog input port 203, a digital IN (input) port 201 and a digital OUT (output) port 206.

The first input of multiplexer 204 is connected to the VIL input port 202, while the second input of multiplexer 204 is tied to the VIH input port 203. The positive (+) input of comparator 205 is connected to the input port 201. The negative (−) input of comparator 205 is connected to the output of multiplexer 204. The output of comparator 205 is connected to the select input of multiplexer 204 and to output port 206. The output of comparator 205 and the select input of multiplexer 204 are designed to be compatible with standard logic voltage levels.

In the preferred embodiment, digital data is applied to input port 201, while user-defined dc reference voltages are applied to VIL input port 202 and VIH input port 203, such that V(VIL)<V(VIH). V(VIL) and V(VIH) directly define the low and high input switching threshold voltage levels of comparator 205 relative to V(IN). Please refer to Table 5 for the preferred values of VIL and VIH for common backplane standards.

When the output of comparator 205 is low, multiplexer 204 connects V(VIH) to the negative input of comparator 205. When the output of comparator 205 is high, multiplexer 204 connects V(VIL) to the negative input of comparator 205. The OUT output port 206 (output of comparator 205) switches from low to high when V(IN)>V(VIH). Conversely, output port 206 switches from high to low when V(IN)<V(VIL). When V(VIL)<V(IN)<V(VIH), the output of comparator 205 remains in its last driven state.

Feedback from output port 206 and the difference in voltage between V(VIL) and V(VIH) introduce a Schmidt trigger-like hysteresis into the input switching threshold voltage levels. This improves input noise immunity and output switching speeds. Table 2 is the truth table depicting the operation of voltage level shifter 200.

TABLE 2

| Voltage Level Shifter 200 Truth Table | |
|---|---|
| IN | OUT |
| V(IN) < V(VIL) | 0 |
| V(IN) > V(VIH) | 1 |
| V(VIL) < V(IN) < V(VIH) | Last State |

It should be noted that digital output port 206 can be designed to switch between any two voltage levels. In the preferred embodiment, the high and low voltage levels are selected to match the operating voltages of the device or devices connected to digital output port 206. Such devices include a printed circuit board or a core of an integrated circuit. V(VIL) and V(VIH) can be set by the user to match that of any digital logic family and can be changed at anytime.

Figure 2:
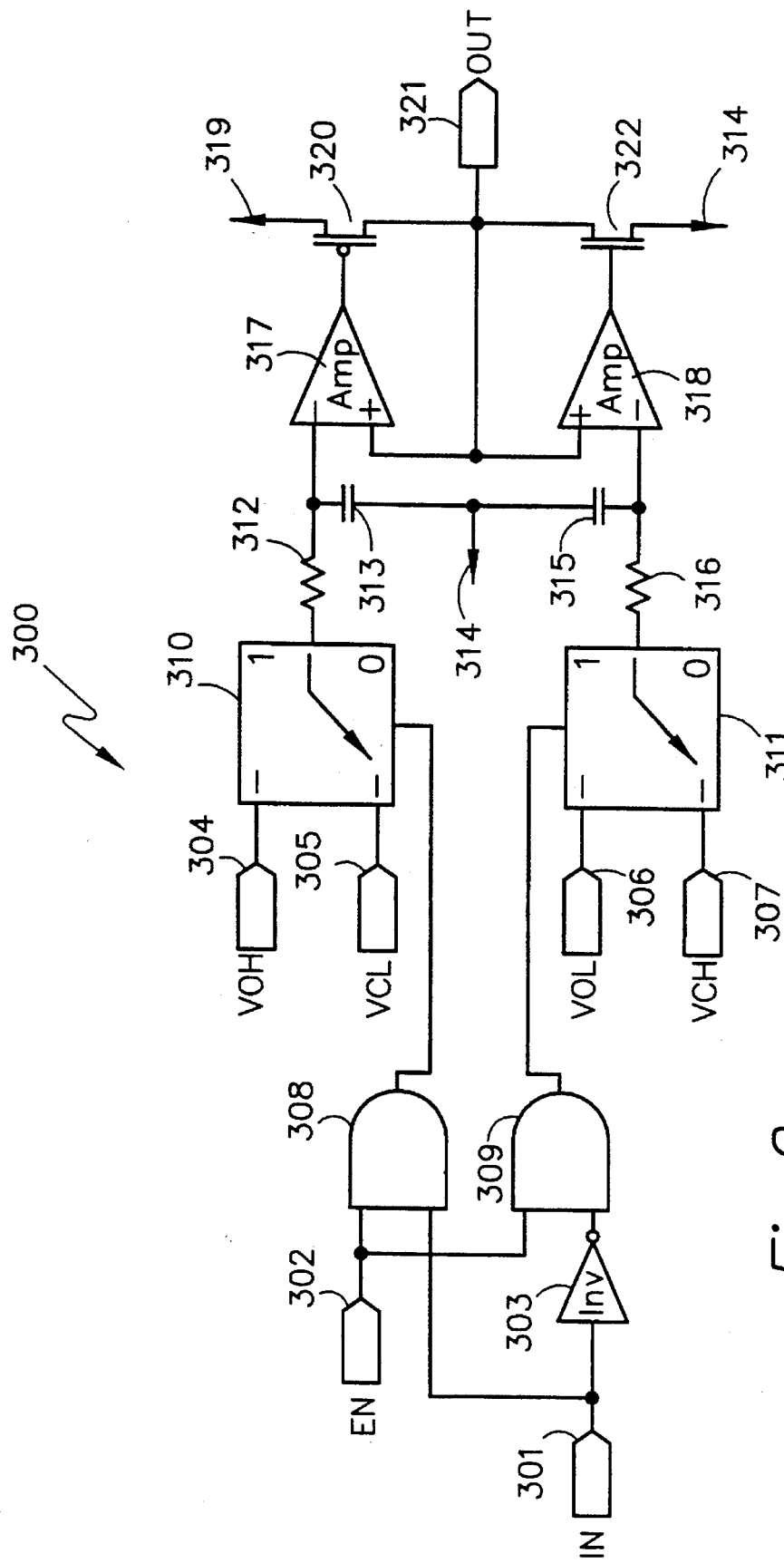
FIG. 2 is a schematic diagram depicting a voltage level shifter with user-definable output drive and clamp voltage levels.

FIG. 2 schematically depicts a voltage level shifter 300 having user-definable output drive and clamp voltage levels. In the preferred embodiment, level shifter 300 is comprised of a first voltage operational amplifier 317, a second voltage operational amplifier 318, a first 2:1 analog multiplexer 310 to a second 2:1 analog multiplexer 311, a first AND gate 308, a second AND gate 309, an inverter gate 303, a p-channel transistor 320, an n-channel transistor 322, a first resistor 312, a second resistor 316, a first capacitor 313, a second capacitor 315, a power connection 319, a ground connection 314, a VCL (voltage clamp low) analog input port 305, a VOL (voltage output low) analog input port 306, a VOH (voltage output high) analog input port 304, a VCH (voltage clamp high) analog input port 307, an IN (input) digital input port 301, an EN (enable) digital input port 302 and an OUT (output) digital output port 321.

Herein, user-defined voltages VOL, VOH, VCL and VCH are referred to as reference voltages. V(VCL), V(VOL), V(VOH) and V(VCH) can be set by the user to match those of any logic family as described in Table 5. In this invention, the voltages can be changed depending on the application.

The first input of multiplexer 311 is connected to VCH input port 307, while the second input is connected to VOL input port 306. The first input of multiplexer 310 is connected to VCL input port 305, while the second input is connected to VOH input port 304. The output of multiplexer 310 is connected through a first R-C low-pass filter, comprised of resistor 312 and capacitor 313, to the negative (−) input of op amp 317. The output of multiplexer 311 is connected through a second R-C low-pass filter, comprised of resistor 316 and capacitor 315, to the negative (−) input of op amp 318. Capacitors 313 and 315 are referenced to ground 314. The output of op amp 318 is connected to the gate of n-channel transistor 322. The output of op amp 317 is connected to the gate of p-channel transistor 320. The drains of both n-channel transistor 322 and p-channel transistor 320, the positive (+) input of op amps 317 and 318, and output port 321 are electrically connected. The source of p-channel transistor 320 is connected to power 3 19. The source of n-channel transistor 322 is connected to ground 3 14. IN input port 301 is connected to the first input of AND gate 308 and to the input of inverter gate 303. The output of inverter gate 303 is connected to the first input of AND gate 309. EN input port 302 is connected to the second input of AND gates 308 and 309. The output of AND gate 309 is connected to the select input of multiplexer 311. The output of AND gate 308 is connected to the select input of multiplexer 310. One skilled in the art will recognize that the select input of multiplexers 310 and 311 and the inputs and output of AND gates 308 and 309 and inverter gate 303 can be designed to be compatible with any number of standard logic voltage levels.

In the preferred embodiment, digital data is applied to IN input port 301 and EN input port 302, while user-defined reference voltages are applied to VCL input port 305, VOL input port 306, VOH input port 304 and VCH input port 307, such that V(VCL)<V(VOL)<V(VOH)<V(VCH). Voltage level shifter 300 uses voltage feedback and amplification to drive or clamp the voltage at output port 321 to the reference voltages selected by the multiplexers 310 and 311. The digital logic levels applied to IN input port 301 and EN input port 302 select the logic state (tristate, low or high) applied at OUT output port 321. V(VCL) and V(VCH) directly define the low and high output clamp voltages at OUT output port 321. V(VOL) and V(VOH) directly define the low and high output drive voltages at OUT output port 321.

When V(EN) is a logic low, V(VCL) is connected through multiplexer 310 and the first R-C low pass filter to the negative (−) input of the op amp 317, and V(VCH) is connected through multiplexer 311 and the second R-C low pass filter to the negative (−) input of op amp 318. If V(VCL)<V(OUT)<V(VCH), the output of op amp 317 is high and the output of op amp 318 is low and transistors 320 and 322 are both off. If V(OUT)<V(VCL), the output of op amp 317 goes low which turns on p-channel transistor 320 until V(OUT)>V(VCL). If V(OUT)>V(VCH), the output of op amp 318 goes high, which turns on n-channel transistor 322 until V(OUT)<V(VCH). Thus, voltage level shifter 300 presents a high impedance at OUT output port 321 for V(VCL)<V(OUT)<V(VCH) and clamps V(OUT) between V(VCL) and V(VCH).

When V(EN) is a logic high and V(IN) is a logic low, V(VCL) is connected through multiplexer 310 and the first R-C low pass filter to the negative (−) input of op amp 317, and V(VOL) is connected through multiplexer 311 and the second R-C low pass filter to the negative (−) input of op amp 318. If V(VCL)<V(OUT)<V(VOL), the output of op amp 317 is high and the output of op amp 318 is low and output transistors 320 and 322 are both off. If V(OUT)<V(VCL), the output of op amp 317 goes low which turns on p-channel transistor 320 until V(OUT)>V(VCL). If V(OUT)>V(VOL), the output of op amp 318 goes high which turns on n-channel transistor 322 until V(OUT)<V(VOL). Thus, voltage level shifter 300 drives V(OUT) to a logic low and then clamps V(OUT) between V(VOL) and V(VCL).

When V(EN) is a logic high and V(IN) is a logic high, V(VOH) is connected through multiplexer 310 and the first R-C low pass filter to the negative (−) input of op amp 317, and V(VCH) is connected through multiplexer 311 and the second R-C low pass filter to the negative (−) input of op amp 318. If V(VOH)<V(OUT)<V(VCH), the output of op amp 317 is high and the output of op amp 318 is low and both output transistors 320 and 322 are off. If V(OUT)<V(VOH), the output of op amp 317 goes low which turns on p-channel transistor 320 until V(OUT)>V(VOH). If V(OUT)>V(VCH), the output of op amp 318 goes high which turns on n-channel (or npn) transistor 322 until V(OUT)<V(VCH). Thus, voltage level shifter 300 drives V(OUT) to a logic high and then clamps V(OUT) between V(VOH) and V(VCH).

The first and second R-C low-pass filters limit the rate of the reference voltage change at the negative (−) inputs of op amps 317 and 318, respectively. This limits the voltage slew rate at OUT output port 321. The high speed feedback loop from OUT output port 321 to the positive (+) input of the op amps 317 and 318 provides for fast output voltage regulation independent of the R-C voltage slew rate control. It should be noted that resistor 312 and 316 must not be so large as to affect the drive input to op amps 317 and 318, respectively. In most situations, this will not be a problem, as op amps 317 and 318 will typically have a high input impedance.

Table 3 is the truth table for the output path of voltage level shifter 300 from IN input port 301 and EN input port 302 to OUT output port 321.

TABLE 3

Voltage Level Shifter 300 Truth Table

| IN | EN | OUT |
|---|---|---|
| 0 | 0 | V(VCL) < V(OUT) < V(VCH) |
| 0 | 1 | V(VCL) < V(OUT) < V(VOL) |
| 1 | 0 | V(VCL) < V(OUT) < V(VCH) |
| 1 | 1 | V(VOH) < V(OUT) < V(VCH) |

It should be noted that inverter 303 ensures that transistors 320 and 322 are not on at the same time. Furthermore, one skilled in the art will recognize that other circuitry configurations can be used consistent with the teachings of this invention. Particularly, CMOS transistors 320 and 322 can be replaced with corresponding bi-polar components. Furthermore, other circuitry can be utilized to replace inverter 303, AND gates 308 and 309, multiplexers 310 and 311, resistors 312 and 316, and capacitors 313 and 315 so long as op-amps 317 and 318 are provided signals in substantially the same manner as described above.

Figure 3:
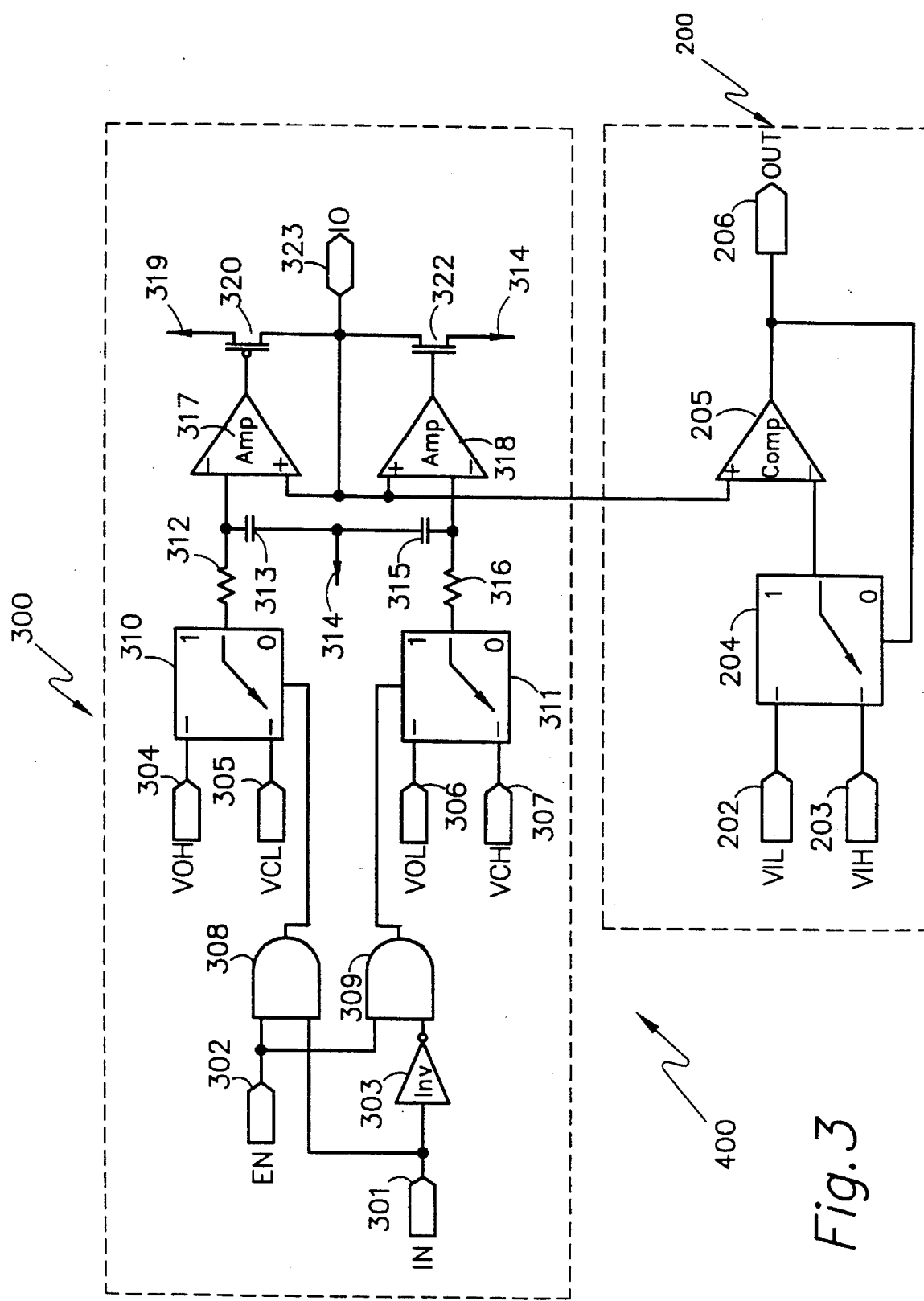
FIG. 3 is a schematic diagram depicting a bi-directional voltage level shifter.

FIG. 3 schematically depicts the preferred embodiment of a bi-directional voltage level shifter 400 with user-definable input switching and output drive and clamp voltage levels.

It should be noted that components having the same function as described in the previous figures have retained the same numerical identification.

In the preferred embodiment, bi-directional voltage level shifter 400 is comprised of a voltage level shifter 200 described in FIG. 1 and a voltage level shifter 300 described in FIG. 2. IN input port 201 of voltage level shifter 200 is connected to OUT output port 321 of voltage level shifter 300. Thus, output port 321 functions as a bi-directional (I/O) port.

Digital data is applied to IN input port 301 and EN input port 302, while the user-defined dc reference voltages are applied to VCL input port 305, VOL input port 306, VIL input port 202, VIH input port 203, VOH input port 304 and VCH input port 307, such that V(VCL)<V(VOL)<V(VIL)<V(VIH)<V(VOH)<V(VCH). Bi-directional voltage level shifter 400 uses voltage feedback and amplification to drive or clamp the voltage at bi-directional port 323 to the reference voltages selected by the multiplexers 310 and 311. The digital logic levels applied to IN input port 301 and EN input port 302 select the logic state (tristate, low or high) applied at IO bi-directional port 323. V(VCL) and V(VCH) directly define the low and high output clamp voltages at IO bi-directional port 323. V(VOL) and V(VOH) directly define the low and high output drive voltages at IO bi-directional port 323. V(VIL) and V(VIH) directly define the low and high input switching threshold voltage levels of comparator 205 relative to V(IO). Table 4a is the truth table depicting the operation of the bi-directional voltage level shifter 400 input path from bi-directional port 323 to OUT output port 321. Table 4b is the truth table depicting the operation of bi-directional voltage level shifter 400 from IN input port 301 and EN input port 302 to bi-directional port 323.

TABLE 4a

Bi-directional Voltage Level Shifter Input Truth Table

| IO | OUT |
|---|---|
| V(IO) < V(VIL) | 0 |
| V(IO) > V(VIH) | 1 |
| V(VIL) < V(IO) < V(VIH) | Last |

TABLE 4b

Bi-directional Voltage Level Shifter Output Truth Table

| IN | EN | IO |
|---|---|---|
| 0 | 0 | V(VCL) < V(IO) < V(VCH) |
| 0 | 1 | V(VCL) < V(IO) < V(VOL) |
| 1 | 0 | V(VCL) < V(IO) < V(VCH) |
| 1 | 1 | V(VOH) < V(IO) < V(VCH) |

Table 5 depicts the preferred voltage levels for VIL, VIH, VOL, VOH, VCL and VCH for the present invention as they relate to standard backplane specifications. In the preferred embodiment, VCL is selected to be approximately 0.5 volts less than VIL when VCH is selected to be approximately 0.5 volts above VOH. It should be noted, however, that a voltage range from 0.5 to 0.7 volts above VOL or above VOH can be utilized without degrading performance.

TABLE 5

Preferred Voltage Levels for VIL, VIH, VOL, VOH, VCL, VCH

| Backplane Specification Name | Input Threshold Voltage Levels | | Output Drive Voltage Levels | | Clamp Voltage Levels | |
| --- | --- | --- | --- | --- | --- | --- |
| | VIL | VIH | VOL | VOH | VCL | VCH |
| Backplane Transceiver Logic (BTL) | 1.475 | 1.625 | 1.100 | 2.100 | 0.600 | 2.600 |
| Center-Tapped Termination (CTT) | 1.300 | 1.700 | 1.100 | 1.900 | 0.600 | 2.100 |
| Enhanced Transceiver Logic (ETL) | 1.400 | 1.600 | 0.400 | 2.400 | −0.100 | 2.900 |
| Gunning Transceiver Logic (GTL) | 0.750 | 0.850 | 0.400 | 1.200 | −0.100 | 1.700 |
| Kuo Transceiver Logic (KTL) | 0.950 | 1.050 | 0.600 | 1.400 | 0.100 | 1.900 |
| Lipp Transceiver Logic (LTL) | 1.700 | 2.100 | 0.000 | 3.300 | −0.500 | 3.800 |
| Low Voltage Swing CMOS (LVSC) | 0.475 | 1.625 | 1.100 | 2.100 | 0.600 | 2.600 |
| Low Voltage TTL (LVTTL) | 0.800 | 2.000 | 0.400 | 2.400 | −0.100 | 2.900 |

Although the present invention has been described with reference to preferred embodiments, those skilled in the art will recognize changes that may be made in form or detail without departing from the spirit and scope of the invention. For example, the reference voltages VIL, VIH, VOL, VOH, VCL and VCH can be derived directly from a single reference voltage or system power supply by using a simple resistor ladder widely known in the art. In such a configuration, the reference voltages will track the supply or reference voltage from which they are derived. This allows all reference voltages to be altered simultaneously by changing the supply voltage. One skilled in the art will recognize that this would be particularly advantageous for level shifters that are designed to be used with several different backplane specifications. Such a device could have the voltage reference input parts connected to a different power supply depending upon which specification is in use. It should also be noted that the reference voltages can be altered individually by connecting each to a single supply voltage.

It should also be noted that several level shifters constructed in accordance with the present invention could be used on a data bus having a plurality of data lines. In such a configuration, each level shifter's enable terminal could be tied to a single terminal. Likewise, each of the reference voltages could also be tied together, thus allowing the voltage shifters to remain matched.

I claim:

1. A voltage level shifter, comprising:

an input receiving an input signal;

an output having two modes of operation: an output mode to drive and clamp an output voltage between an adjustable low clamp voltage and a low drive reference voltage when the input signal is at a low logic level and to drive and clamp the output voltage between an adjustable high drive voltage and a high clamp reference voltage when the input signal is at a high logic level; and a high impedance/clamp mode to present a high impedance to an output signal on said output to clamp the output signal between an adjustable low clamp reference voltage and an adjustable high clamp reference voltage; and an enable line to select the operation mode of said output.

2. A voltage level shifter as recited in claim 1, wherein the output signal is a digital signal.

3. A voltage level shifter as recited in claim 1, wherein said output has an impedance when in a tristate mode.

4. A voltage level shifter as received in claim 1, wherein the input signal is a digital signal.

5. A bi-directional voltage level shifter, comprising:

an input section having an input, an output, an adjustable first low voltage reference and an adjustable first high voltage reference, said input section, in response to a first signal received at the input of said input section, producing, at the output, a first digital signal having a low logic level when said first signal is below the first low voltage reference and a high voltage level when said first signal is above the first high voltage reference; and an output section having an input, an output, an adjustable second low voltage reference and an adjustable second high voltage reference, said output section producing, in response to a second digital signal received at the input of said output section, an output signal at the output having a voltage equal to the second high voltage reference when the second digital signal is high and equal to the second low voltage reference when the second digital signal is low.

6. A bi-directional voltage level shifter as recited in claim 5, wherein the first signal received by said input section is a digital signal.

7. A bi-directional voltage level shifter as recited in claim 5, wherein the low logic level voltage of the first digital signal is less than the first low voltage reference.

8. A bi-directional voltage level shifter as recited in claim 5, wherein the low logic level voltage of the first digital signal is greater than the first low voltage reference.

9. A bi-directional voltage level shifter as recited in claim 5, wherein the low logic level voltage of the second digital signal is greater than the second low voltage reference.

10. A bi-directional voltage level shifter as recited in claim 5, wherein the low logic level voltage of the second digital signal is less than the second low voltage reference.

11. A bi-directional voltage level shifter as recited in claim 5, wherein the high logic level voltage of the first digital signal is less than the first high voltage reference.

12. A bi-directional voltage level shifter as recited in claim 5, wherein the high logic level voltage of the first digital signal is greater than the first high voltage reference.

13. A bi-directional voltage level shifter as recited in claim 5, wherein the high logic level voltage of the second digital signal is greater than the second high voltage reference.

14. A bi-directional voltage level shifter as recited in claim 5, wherein the high logic level voltage of the second digital signal is less than the second high voltage reference.

15. A bi-directional voltage level shifter as recited in claim 5, wherein the input of the input section is electrically connected to the output of the output section.

16. A bi-directional voltage level shifter as recited in claim 5, wherein the output of the input section is electrically connected to the input of the output section.

* * * * *